US010483145B2

(12) United States Patent
Koelmel

(10) Patent No.: US 10,483,145 B2
(45) Date of Patent: Nov. 19, 2019

(54) WAFER EDGE MEASUREMENT AND CONTROL

(71) Applicant: Applied Materials, Inc., Santa Clara, CA (US)

(72) Inventor: Blake Koelmel, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 84 days.

(21) Appl. No.: 15/727,105

(22) Filed: Oct. 6, 2017

(65) Prior Publication Data

US 2018/0033667 A1 Feb. 1, 2018

Related U.S. Application Data

(62) Division of application No. 13/870,637, filed on Apr. 25, 2013, now Pat. No. 9,786,537.

(60) Provisional application No. 61/637,984, filed on Apr. 25, 2012.

(51) Int. Cl.
*H01L 21/68* (2006.01)
*H01L 21/67* (2006.01)

(52) U.S. Cl.
CPC ...... *H01L 21/681* (2013.01); *H01L 21/67259* (2013.01)

(58) Field of Classification Search
CPC ............. H01L 21/67259; H01L 21/681; Y10T 29/49762; Y10T 29/53087
See application file for complete search history.

(56) References Cited

U.S. PATENT DOCUMENTS

| 4,457,664 A | 7/1984 | Judell et al. |
| 5,238,354 A * | 8/1993 | Volovich ............... H01L 21/681 356/400 |
| 5,258,823 A * | 11/1993 | Akamatsu ............. H01L 21/681 356/401 |

(Continued)

FOREIGN PATENT DOCUMENTS

| CN | 101911281 A | 12/2010 |
| JP | 2005-333116 A | 12/2005 |
| KR | 10-2010-0082312 A | 7/2010 |

OTHER PUBLICATIONS

International Search Report, PCT Application: PCT/US2013/035168, dated Jul. 23, 2013.

(Continued)

*Primary Examiner* — Christopher M Koehler
(74) *Attorney, Agent, or Firm* — Patterson + Sheridan LLP

(57) ABSTRACT

Devices and methods are provided for positioning and/or rotating a substrate without solid contact, such as by floating the wafer on a thin layer of gas. Since there is no solid contact with components of a processing chamber, features on the wafer are used to determine wafer position and rotational speed. Closed loop control systems are provided with capacitive sensors to monitor the position of the edge of the wafer in a horizontal plane. Control systems may also monitor the position of a wafer feature as it rotates, such as a notch in the edge of the wafer. Because the presence of a notch can disrupt sensors facing the edge of the wafer, methods and devices to reduce or eliminate this disruption are also provided.

20 Claims, 4 Drawing Sheets

(56) References Cited

U.S. PATENT DOCUMENTS

| | | | |
|---|---|---|---|
| 6,342,705 B1* | 1/2002 | Li | G01B 11/24 250/559.22 |
| 6,677,602 B1* | 1/2004 | Norton | H01L 21/681 250/559.29 |
| 8,057,602 B2 | 11/2011 | Koelmel et al. | |
| 8,089,622 B2 | 1/2012 | Birkner et al. | |
| 9,245,786 B2* | 1/2016 | Koelmel | H01L 21/67115 |
| 2003/0023343 A1 | 1/2003 | Tomita et al. | |
| 2003/0160971 A1* | 8/2003 | Krause | H01L 21/681 356/614 |
| 2004/0124413 A1 | 7/2004 | Arai et al. | |
| 2004/0136000 A1* | 7/2004 | Kurokawa | B23Q 1/52 356/401 |
| 2008/0181752 A1* | 7/2008 | Takahashi | H01L 21/681 414/222.02 |
| 2008/0212084 A1* | 9/2008 | Watkins | G01N 21/9503 356/237.5 |
| 2008/0276864 A1* | 11/2008 | Koelmel | H01L 21/67115 118/500 |
| 2008/0280453 A1* | 11/2008 | Koelmel | H01L 21/67115 438/758 |
| 2008/0316505 A1* | 12/2008 | Graf | H01L 21/67259 356/614 |
| 2009/0010626 A1 | 1/2009 | Ramamurthy et al. | |
| 2009/0181553 A1* | 7/2009 | Koelmel | C23C 16/4586 438/799 |
| 2010/0030347 A1* | 2/2010 | Shindo | H01L 21/67259 700/59 |
| 2010/0171966 A1* | 7/2010 | Yamamoto | H01L 21/681 356/614 |
| 2010/0200545 A1* | 8/2010 | Koelmel | C23C 16/4584 216/58 |
| 2010/0264132 A1* | 10/2010 | Koelmel | H01L 21/68 219/647 |
| 2011/0085725 A1* | 4/2011 | Pai | G01N 21/9501 382/145 |
| 2012/0304928 A1* | 12/2012 | Koelmel | H01L 21/67115 118/712 |
| 2012/0309115 A1* | 12/2012 | Koelmel | H01L 21/6838 438/5 |
| 2015/0198899 A1* | 7/2015 | Fukushi | G03F 7/70775 355/73 |

OTHER PUBLICATIONS

Chinese Office Action (with attached English translation of the Search Report) for Application No. 201380011065.X; dated May 31, 2016; 11 total pages.

Taiwanese Office Action (with attached English translation of the Search Report) for Application No. 102112721; dated Jan. 23, 2017; 6 total pages.

Chinese Office Action (with attached English translation of the Search Report) for Application No. 201380011065.X; dated Feb. 4, 2017; 12 total pages.

Korean Patent Application No. 10-2014-7029476, Notice of Preliminary Rejection, dated Jun. 28, 2019, 12 pages.

* cited by examiner

WAFER EDGE MEASUREMENT AND CONTROL

CROSS-REFERENCE TO RELATED APPLICATIONS

This application is a divisional application of co-pending U.S. patent application Ser. No. 13/870,637, filed on Apr. 25, 2013, which claims benefit of U.S. Provisional Patent Application Ser. No. 61/637,984, filed on Apr. 25, 2012. Each of afore mentioned patent applications is incorporated herein by reference.

BACKGROUND

Field

Aspects of the present invention generally relate to methods and devices for positioning and/or rotating a substrate during semiconductor device fabrication in a processing chamber.

Description of the Related Art

Integrated circuits are complex devices that can include millions of transistors, capacitors and resistors on a single chip. Chip design continually requires faster circuitry and greater circuit density and thus demands increasingly precise fabrication processes.

In some fabrication processes, such as ion implantation, film layers on the substrate develop high levels of internal stress. In order to relieve the stress and control the film properties and uniformity, the film is subjected to a thermal process, such as annealing. Rapid thermal processing (RTP) chambers subject substrates to highly controlled thermal cycles, such as heating a substrate to over 1000° C. in less than ten seconds. RTP relieves stresses in film layers and can also be used to modify film properties such as changing the density or the electrical characteristics of the film.

However, RTP processes can cause uneven heating across the surface of the substrate, especially where the substrate is in contact with other components such as a substrate support or a support ring. For example, in many wafer (substrate) handling systems, the wafer handler may comprise an assembly that comes in contact with the wafer. This is beneficial in cases where the handled wafer needs to be rotated, because the position and rotational speed can be controlled using features that are designed into the wafer handler or rotor. But problems arise from uneven heating of the wafer due to the wafer contact.

Accordingly, systems have been developed to support, position and rotate a wafer during an annealing process without direct contact with the wafer. U.S. Pat. Nos. 8,057,602 and 8,057,601, assigned to Applied Materials, Inc., describe devices and methods for floating, positioning and rotating a wafer on a thin layer of air, and are herein incorporated by reference. Because the wafer is no longer in direct solid contact with other system components, precise sensors and control systems are needed to monitor and control both the position and the rotation of the wafer.

For no-contact wafer positioning, optical sensors have been used to monitor the position of the wafer's outer edge. However, optical sensors may suffer reliability problems when exposed to harsh chamber conditions, due to high temperature exposures (in some cases over 1000° C.) or due to process gases leaving deposits on the optical components. Additionally, a reliable solution is needed for tracking and controlling wafer rotation. In the past, a notch on the outer edge of a wafer has been used to orient wafers in processing chambers. However, if notched wafers are used in no-contact wafer positioning systems, errors are introduced whenever the notch rotates through the field of view of an optical sensor. Whenever an optical sensor "sees" the notch, a system controller tries to "re-center" the wafer, and mistakenly moves the wafer off-center. When that particular sensor sees the true edge again, another correction is prompted. Therefore, a need exists for improved devices and methods for positioning and rotating wafers without direct solid contact.

SUMMARY

Devices and methods for positioning and/or rotating a wafer are provided. In one embodiment, a method is provided for positioning and rotating a substrate in a processing chamber, the method comprising: supporting a substrate by a substrate positioning assembly disposed in an inner volume of a processing chamber, wherein the substrate has a non-uniformity on an outer diameter edge, and the processing chamber has first and second sensors directed to first and second edge portions of the substrate, respectively, and a rotation sensor for monitoring rotation of the substrate; rotating the substrate; measuring a position of the substrate with the first and second sensors; determine a value indicative of the location of the non-uniformity on the outer diameter edge of the substrate with the rotation sensor; and controlling the rotation of the substrate such that the non-uniformity does not pass through a field of view of either the first or second sensors.

In further embodiments, the method further comprises controlling the position of the substrate in the X and Y directions with a first set of actuators coupled to a control system; and controlling the rotation of the substrate with a second set of actuators coupled to the control system, wherein the second set of actuators apply a torque to the substrate and the control system measures the location of the non-uniformity. In additional embodiments, the non-uniformity comprises a notch on the outer diameter edge of the substrate, the first sensor measures the position of the substrate in the X direction, the second sensor measures the position of the substrate in the Y direction, and the rotation sensor measures the location of the notch as a relative value based on an angle about the Z axis. In yet more embodiments, the rotation sensor comprises a camera. In other embodiments, the first and second sensors comprise capacitive sensors positioned on the same X-Y plane, the method further comprising measuring a distance in the Z direction of the substrate from the X-Y plane of the first and second sensors by using a third capacitive sensor, wherein the third capacitive sensor is positioned between the first and second sensors on the same X-Y plane and the third capacitive sensor is positioned radially inwards such that the edge of the substrate is not within the field of view of the third sensor.

In another embodiment, a method is provided for positioning and rotating a substrate in a processing chamber, the method comprising: supporting a substrate by a substrate positioning assembly disposed in an inner volume of a processing chamber, wherein the substrate has a non-uniform portion on an outer diameter edge, and the processing chamber comprises: a first sensor directed to a first edge portion of the substrate; a second sensor directed to a second edge portion of the substrate; a rotation sensor for monitoring rotation of the substrate; and a control system electrically coupled to the first sensor, the second sensor and the control system; measuring one or more values indicative of a position of the substrate with the first and second sensors; positioning the substrate using a first set of actuators coupled to the control system; rotating the substrate using a second set of actuators coupled to the control system, wherein the second set of actuators apply a torque to the substrate; measuring a value indicative of the location of the non-uniform portion on the outer diameter edge of the substrate with the rotation sensor; and determining when the non-uniform portion passes through a field of view of one or more of the first and second sensors in order to reduce disruptions to the step of positioning the substrate.

In further embodiments, the non-uniform portion comprises a notch on the outer diameter edge of the substrate, the first sensor measures the position of the substrate in the X direction, and the second sensor measures the position of the substrate in the Y direction. In more embodiments, the control system uses the rotation sensor to measures the location of the notch as a relative value based on an angle about the Z axis. In yet other embodiments, the control system uses the rotation sensor to determine revolutions per minute (RPM) of the substrate. In still other embodiments, the first and second sensors comprise capacitive sensors positioned on the same X-Y plane, the method further comprising measuring a distance in the Z direction of the substrate from the X-Y plane of the first and second sensors by using a third capacitive sensor, wherein the third capacitive sensor is positioned between the first and second sensors on the same X-Y plane and the third capacitive sensor is positioned radially inwards such that the edge of the substrate is not within the field of view of the third sensor. In additional embodiments, the rotation sensor comprises a camera.

For another embodiment, a method is provided for positioning and rotating a substrate in a processing chamber, the method comprising: supporting a substrate by a substrate positioning assembly disposed in an inner volume of a processing chamber, wherein the substrate has a non-uniform portion on an outer diameter edge, and the processing chamber comprises: a first sensor directed to a first edge portion of the substrate; a second sensor directed to a second edge portion of the substrate; and a control system electrically coupled to the first sensor and the second sensor; measuring one or more values indicative of a position of the substrate with the first and second sensors; positioning the substrate using a first set of actuators coupled to the control system; rotating the substrate using a second set of actuators coupled to the control system, wherein the second set of actuators apply a torque to the substrate; measuring a value indicative of the location of the non-uniform portion on the outer diameter edge of the substrate by determining when the non-uniform portion passes through a field of view of either the first or second sensors; and calculating one or more estimated time periods when the non-uniform portion will pass through the field of view of either the first or second sensors in order to reduce disruptions to the step of positioning the substrate.

In additional embodiments, the non-uniform portion comprises a notch on the outer diameter edge of the substrate, the first sensor measures the position of the substrate in the X direction, and the second sensor measures the position of the substrate in the Y direction. In further embodiments, the control system calculates the estimated location of the notch as a relative value based on an angle about the Z axis. In other embodiments, the control system calculates revolutions per minute (RPM) of the substrate. In yet further embodiments, the first and second sensors comprise capacitive sensors positioned on the same X-Y plane, the method further comprising measuring a distance in the Z direction of the substrate from the X-Y plane of the first and second sensors by using a third capacitive sensor, wherein the third capacitive sensor is positioned between the first and second sensors on the same X-Y plane and the third capacitive sensor is positioned radially inwards such that the edge of the substrate is not within the field of view of the third sensor.

In a different embodiment, an apparatus is provided for processing a substrate, comprising: a chamber body defining an inner volume; a substrate positioning assembly disposed in the inner volume, wherein the substrate positioning assembly is capable of positioning and rotating a substrate at least within a horizontal plane; a first capacitive sensor disposed in the inner volume, wherein the first capacitive sensor is positioned to detect a location of an edge of the substrate at a first edge location; a second capacitive sensor disposed in the inner volume, wherein the second capacitive sensor is positioned to detect a location of the edge of the substrate at a second edge location; a third capacitive sensor disposed in the inner volume at a position between the first and second capacitive sensors, wherein the third capacitive sensor is positioned to detect a vertical location of the substrate; and a controller coupled to the first, second, and third capacitive sensors, wherein the controller is programmed to determine a first time period when a non-uniform portion on an outer diameter edge of the substrate passes through a field of view of the first capacitive sensor and to determine a second time period when the non-uniform portion passes through a field of view of the second capacitive sensor.

In further embodiments, the first and second sensors are positioned at a 90 degree angle such that the first sensor measures the position of the substrate in the X direction and the second sensor measures the position of the substrate in the Y direction. In other embodiments, the controller is programmed to determine the revolutions per minute (RPM) of the substrate based on measuring when the non-uniform portion on the outer diameter edge of the substrate passes through the respective fields of view of the first and second sensors. In yet other embodiments, the apparatus further comprises a rotation sensor coupled to the controller and configured to monitor a position of the non-uniform portion on the outer diameter edge of the substrate. Further, the rotation sensor may comprise a camera. In even further embodiments, the apparatus comprises a first set of actuators coupled to the controller and disposed to control the position of the substrate in the X and Y directions. And in another embodiment, the apparatus further comprises a second set of actuators coupled to the controller and disposed to apply a torque to control the rotation of the substrate.

In another embodiment, an apparatus is provided for processing a substrate, comprising: a chamber body defining an inner volume; a substrate positioning assembly disposed in the inner volume, wherein the substrate positioning assembly is capable of positioning and rotating a substrate at least within a horizontal plane; a first capacitive sensor disposed in the inner volume, wherein the first capacitive sensor is positioned to detect a location of an edge of the substrate at a first edge location; a second capacitive sensor disposed in the inner volume, wherein the second capacitive sensor is positioned to detect a location of the edge of the substrate at a second edge location; a third capacitive sensor disposed in the inner volume at a position between the first and second capacitive sensors, wherein the third capacitive sensor is positioned to detect a vertical location of the substrate; and a controller coupled to the first, second, and third capacitive sensors, wherein the controller is programmed to control rotation of the substrate such that a non-uniform portion on an outer diameter edge of the substrate does not pass through a field of view of the first capacitive sensor or a field of view of the second capacitive sensor.

In further embodiments, the first and second sensors are positioned at a 90 degree angle such that the first sensor measures the position of the substrate in the X direction and the second sensor measures the position of the substrate in the Y direction. In another embodiment, the apparatus further comprising a rotation sensor coupled to the controller and configured to monitor a position of the non-uniform portion on the outer diameter edge of the substrate. In a further embodiment, the rotation sensor comprises a camera. In yet another embodiment, the apparatus further comprises a first set of actuators coupled to the controller and disposed to control the position of the substrate in the X and Y directions. A still further embodiment comprises a second set of actuators coupled to the controller and disposed to apply a torque to control the rotation of the substrate.

In a different embodiment, an apparatus is provided for processing a substrate, comprising: a chamber body defining an inner volume; a substrate positioning assembly disposed in the inner volume, wherein the substrate positioning assembly is capable of positioning and rotating a substrate at least within a horizontal plane; a first capacitive sensor disposed in the inner volume, wherein the first capacitive sensor is positioned to detect a location of an edge of the substrate at a first edge location; a second capacitive sensor disposed in the inner volume, wherein the second capacitive sensor is positioned to detect a location of the edge of the substrate at a second edge location; a third capacitive sensor disposed in the inner volume at a position between the first and second capacitive sensors, wherein the third capacitive sensor is positioned to detect a vertical location of the substrate; a rotation sensor coupled to the controller; and a controller coupled to the first, second, and third capacitive sensors, wherein the controller is programmed to monitor the position of a non-uniform portion on an outer diameter edge of the substrate.

In a further embodiment, the first and second sensors are positioned at a 90 degree angle such that the first sensor measures the position of the substrate in the X direction and the second sensor measures the position of the substrate in the Y direction. In another embodiment, the controller is programmed to determine the revolutions per minute (RPM) of the substrate. In yet a further embodiment, the rotation sensor comprises a camera. In another embodiment, the apparatus further comprises a first set of actuators coupled to the controller and disposed to control the position of the substrate in the X and Y directions. In an additional embodiment, the apparatus further comprises a second set of actuators coupled to the controller and disposed to apply a torque to control the rotation of the substrate.

BRIEF DESCRIPTION OF THE DRAWINGS

So that the manner in which the recited features can be understood in detail, a more particular description may be had by reference to embodiments, some of which are illustrated in the appended drawings. It is to be noted that the appended drawings illustrate only example embodiments for discussion, and are therefore not drawn to scale and are not limiting of claim scope.

Figure 1:
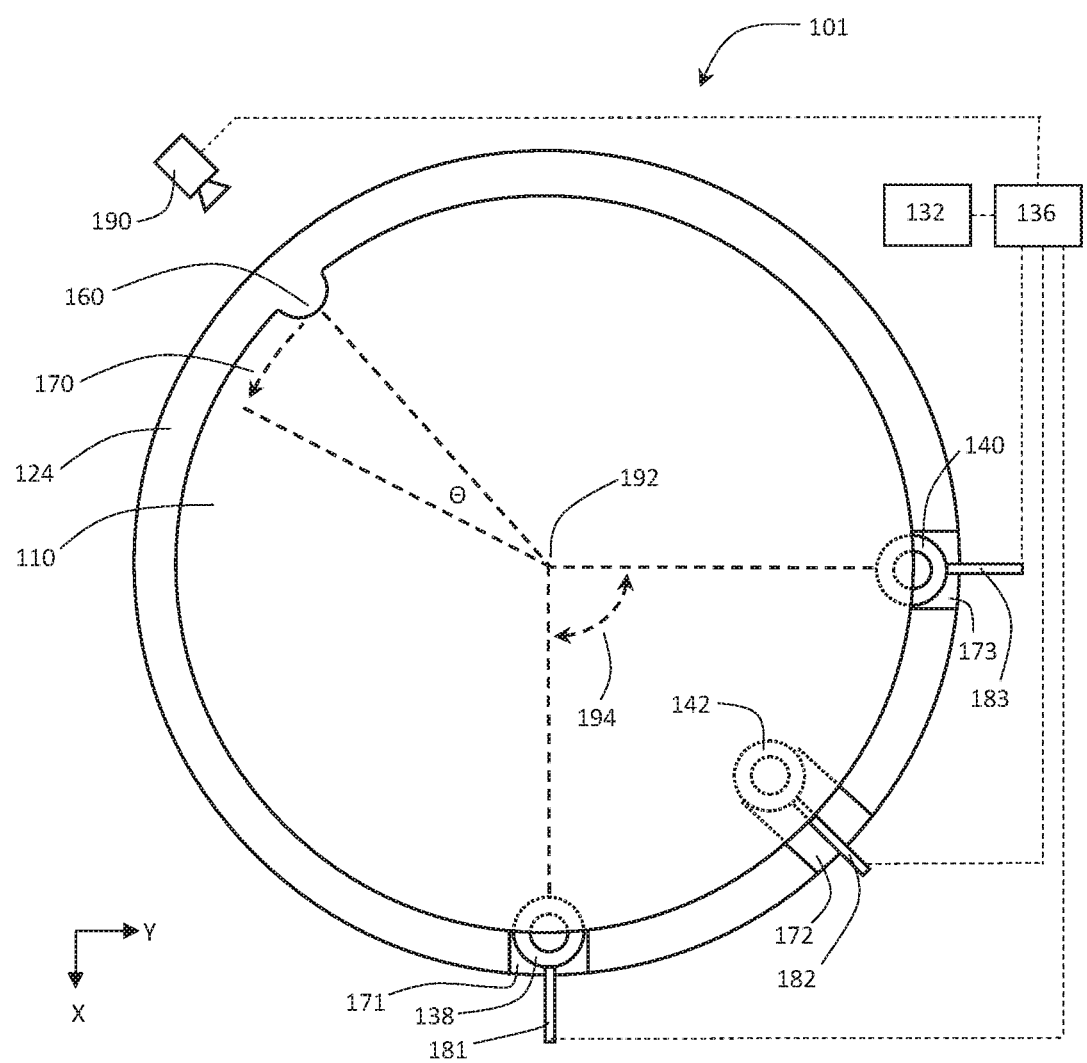
FIG. 1 illustrates a schematic of a wafer control system, according to some embodiments.

It is contemplated that features of one embodiment may be beneficially incorporated in other embodiments without further recitation.

DETAILED DESCRIPTION

Embodiments discussed herein provide devices and methods for positioning and/or rotating a substrate, such as a wafer. Further embodiments relate to measuring and controlling position and rotation of a substrate without direct solid contact. (To create a no-contact wafer support system, gas nozzles may be used to float the wafer on a thin layer of gas, air, or other fluids, including liquids. Alternatively, magnetic levitation may be used.) Since there is no solid contact with components of a processing chamber, features on the wafer are used to determine wafer position and rotational speed. Closed loop control systems may be used with sensors to monitor the position of the edge of the wafer in a horizontal plane. Control systems may also monitor the position of a wafer feature as it rotates, such as a notch in the edge of the wafer. Because the presence of a notch can disrupt sensors facing the edge of the wafer, some embodiments provide methods and devices to reduce or eliminate this disruption.

Embodiments may be used for semiconductor processing, such as rapid temperature anneals (RTP). Embodiments may also be useful in heating applications where it is desired to spread radiative energy from heat lamps more evenly over the entire area of the wafer. Further, rotation may be desired in some deposition applications to minimize chamber geometry effects on deposition uniformity. No-contact (i.e., no-solid-contact) systems provide an advantage in heating uniformity across the wafer, reducing costly ceramic hardware, and reducing difficult planarity alignment procedures. Important advantages are obtained in chemical vapor deposition (CVD) vacuum chambers, where temperature and flow uniformity are critical. No-contact systems permit rotating a wafer with respect to both process gas flow and temperature, without moving heaters or other chamber components. Embodiments may also be used in any application where it is desired to position a wafer precisely or to create temperature uniformity. Embodiments may also reduce particle contamination in some applications. Thus, no-contact systems may also be used in preheat or cooldown stages to avoid creating particles from physical contact with chamber components.

Embodiments may also be used for applications that benefit from controlling or monitoring angular position of a substrate or wafer in no-contact systems. For example, some applications benefit from being able to bring the wafer to a complete stop (or to position the wafer) with the notch (or other non-uniformity) at a specific position in a processing chamber. Repeatability is important to optimize throughput, processing times, transfer times and/or uniformity. In other applications, the wafer may be placed with certain features (such as the notch or other non-uniformity) in a specific position relative to an edge ring. Yet other applications may use an aligner to bring in or remove the wafer from the processing chamber. In this case, having repeatable alignment of the wafer increases throughput time. In additional applications, it is desirable to process a wafer in a certain alignment. For example, when laser annealing a wafer, it may be advantageous to move a laser in line or relative to certain features for improved uniformity and/or to avoid breaking or damaging the wafer. These and other advantages will be apparent to skilled practitioners in the art.

FIG. 1 illustrates a top-down view of a non-contact substrate or wafer control system 101 inside a process chamber, according to some embodiments. As illustrated, a wafer 110 is positioned over a wafer support body 124. The wafer support body 124 has various fluid ports (not shown) disposed underneath the wafer 110. In some embodiments, the fluid ports are gas nozzles. The gas nozzles are configured in different orientations so that gas flow may be used to support, position and/or rotate the wafer 110. The gas nozzles are connected to a fluid delivery system 132, which is coupled to a system controller 136. In addition, the support body 124 may also be heated by embedded heaters. In some embodiments, hot gases may also be delivered through the gas nozzles. (An example configuration of gas ports is illustrated in co-pending application Ser. No. 13/152,154, filed Jun. 2, 2011 and commonly assigned to Applied Materials, Inc., which is hereby incorporated by reference in its entirety. Detailed descriptions of exemplary substrate positioning assemblies using fluid flow may be found in U.S. Pat. Nos. 8,057,602 and 8,057,601, incorporated by reference above.) Sensors 138 and 140 measure the position of the edge of the wafer 110 in the X and Y directions, and feedback the measured location(s) as inputs to the controller 136. The controller 136 may compare the measured values to values for target positions, or acceptable ranges of target positions. The controller 136 may then output a command to a first set of actuators (such as flow control valves) to act on the wafer and move it in the desired direction. While the wafer is being actively supported and positioned using fluid flow (gas or liquid), the wafer will have a propensity to rotate due to a near frictionless system. The controller 136 may also control the direction or speed of rotation by outputting commands to a second set of actuators (such as flow control valves) to apply a torque to the wafer 110. In some embodiments, the system controller 136 executes a closed loop control process to control position and rotation of the wafer 110.

Further embodiments discussed herein relate to measuring the rotation of the wafer. In one embodiment, a rotation sensor 190 may be used to track angular position and/or rotation of the wafer 110. The wafer position may be tracked as a function of an angle theta "Θ" (illustrated by arrow 170) from a reference position zero (illustrated by the position of the notch 160, or other non-uniformity, proximate to the location of the rotation sensor 190, which may be a CCD camera). A rotation sensor 190, such as a camera, may have a field of view for detecting the position of the notch 160 (or other non-uniformity) within that field of view. This allows control of the non-uniformity 160 within that field of view. Additional rotation sensors may be positioned around a portion of the circumference of an area where a wafer is to be positioned, in order to expand the total field of view, up to and including the entire circumference. Rotation sensor 190 may be positioned normal to the wafer surface or at an angle between normal and the horizontal plane of the wafer.

Lighting may also be provided (not shown). For example, the processing chamber may provide backlighting on the underside (or non-processing side) of the wafer, such that sensor 190 may be an optical detector or a light detector. Moreover, one or more laser beams and detectors may be used as rotation sensors to detect the position of the non-uniformity 160. A laser detector 190 may measure emissivity differences from light reflected off the wafer's surface, or may measure when light is able to shine through the non-uniformity 160. Further, mirrors may be positioned in the chamber for directing or reflecting light. In some embodiments, a two way mirror may be used. Alternatively, capacitive sensors may be used to monitor rotation or angular position. When using laser detectors or capacitive sensors, the sensors may focus on one or more points around the circumference that the non-uniformity 160 can pass through. In this case, a series of rotation sensors 190 may be used to determine the angular position of the wafer.

Various types of sensors may be used for some of the control methods disclosed herein, including the rotational control methods. In some embodiments, wafer edge sensing assemblies comprise light sources disposed on one side of the wafer and light sensors disposed on an opposite side of the wafer. In other embodiments, a retroreflective sensor configuration may be used to sense the position or motion of the substrate, in which retroreflective sensors emit light to the wafer and measure the light reflected back to the sensor. Sensors are preferably disposed on a side of the wafer opposite to the processing side. In manufacturing environments, it can prove difficult to place optical sensors in a chamber where sensitive electronics and surfaces are exposed to harsh chamber conditions or deposition materials. For example, in some applications, temperatures of 1000° C. or 1200° C. or more may be experienced. Windows can be used to protect optical components, but windows can also cloud up due to deposition of process gases, causing sensor measurements to drift and lose accuracy absent frequent cleaning or replacement. Additionally, chamber space may be limited. Thus, there are advantages to limiting the amount of equipment placed in a processing chamber.

Accordingly, it has been discovered that capacitor sensors may be used with no-contact wafer systems to obtain high precision measurements in harsh conditions. FIG. 1 illustrates one embodiment of a non-contact wafer edge measurement and control system, in which sensors 138, 140 and 142 comprise capacitor sensors. Because the wafer is being supported, positioned and rotated by a gas, features of the wafer are used to determine wafer position and rotational speed. (Adding new features to the wafer is typically not a desired option.) Therefore, the outer diameter edge of the wafer 110 may be monitored to control the position of the wafer 110 in a horizontal plane.

In FIG. 1, two sensors 138 and 140 are provided to track the position of the wafer 110 in the X-direction and the Y-direction, respectively, which define the horizontal plane on which the wafer is positioned. It should be appreciated that the X and Y directions are relative, and thus may be moved or reversed. In addition, a third sensor 142 is positioned to measure the distance between wafer 110 and the surface of the sensor 142, which is in the Z-direction or vertical. In FIG. 1, the sensors, 138, 140 and 142 are disposed in cutouts 171, 173 and 172, respectively, of the support body 124, such that the surface of the sensors are disposed in the same horizontal X-Y plane. This plane may coincide with the surface of the support body 124 or with gas nozzles arranged on the support body 124. The sensors 138, 140 and 142 are coupled by electrical lead assemblies 181, 183 and 182, respectively, to the system controller 136. Additionally, the distance measurement from sensor 142 may be used to aid the precision of sensors 138 and 142. Sensor 142 is also positioned closer to a midpoint of the support body 124 (coincident with a midpoint 192 of the wafer), than sensors 138 and 140, such that the edge of the wafer 110 does not enter sensor 142's field of view. Sensor 142 may also be positioned so that a non-uniform portion of the wafer's edge, such as a notch 160, does not enter sensor 140's field of view when the wafer 110 rotates in the direction shown by arrow 170. In FIG. 1, sensor 140 is placed between sensors 138 and 140 (in a direction around the circumference of the support body 124), because if the wafer becomes warped, a single sensor may most accurately read the distance between the wafer and the horizontal plane of the sensors 138 and 140 at or near the midpoint between sensors 138 and 140.

In FIG. 1, sensor 138 is positioned at a separation angle (194) of 90° to sensor 140 around the circumference of the support body 124. Sensor 138 may be used as an X-direction sensor and sensor 140 may be used as a Y-direction sensor. The sensors 138 and 140 may be positioned at any other convenient separation angle besides 180°. In the embodiment shown in FIG. 1, the sensors 138 and 140 are positioned facing the edge of the wafer 110, such that the sensors can detect movement in the X and Y directions, respectively. Accordingly, the sensors 138 and 140 are positioned at two locations along a circle that is substantially the same size as the circumference of the wafer 110. Stated another way, the sensors 138 and 140 are positioned at two locations at a distance about equal to half the diameter of the wafer 110 away from the midpoint of the support body 124, which aligns with a midpoint 192 of the wafer 110. In this arrangement the edge of the wafer 110 is centered above the two sensors 138 and 140 so that the center of each sensor's horizontal sensing range lines up with the edge of the wafer 110, and the sensors 138 and 140 are spaced apart from each other by a separation angle 194 about a point now coincident with the center of the wafer 192. In the embodiment shown in FIG. 1, the separation angle is 90°. (The portion of each sensor and cutout that is positioned beneath the wafer 110 is illustrated by dotted lines.)

In FIG. 1, the sensors 138 and 140 each face perpendicularly towards a tangent line of the wafer 110. The sensors 138, 140 and 142 are disposed in cutouts 171, 173 and 172, respectively, of the support body 124. The cutouts may be of sufficient depth so that the top surfaces of each sensor are in the same horizontal plane. In some embodiments, the top surface of each sensor may be flush to a top surface of the support body 124. In other embodiments, the top surface of each sensor may be flush to gas nozzles disposed in the support body 124. In addition, electrical lead assemblies 181 and 183 serve to couple the sensors 138 and 140, respectively, to the system controller 136. It should be appreciated that other embodiments are also possible, such as facing the sensors 138 and 140 towards the edge of the wafer 110 from a position outside the periphery of the wafer 110. Optionally, a window (not shown) may be placed on the support body 124 over the capacitive sensors 138, 140 and 142. The window may be made from quartz and may have opening to accommodate fluid flow from the fluid ports.

Figure 2:
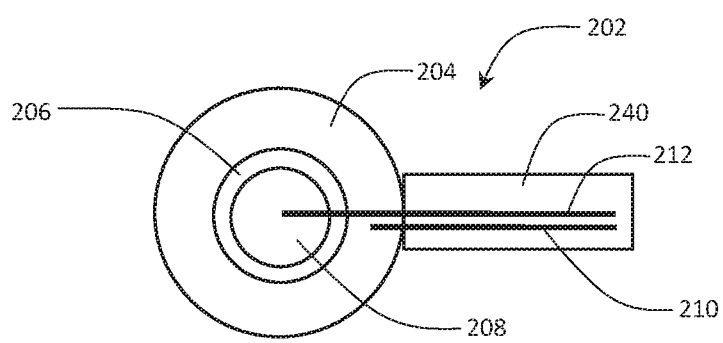
FIG. 2 illustrates a schematic of a capacitor sensor for use in the wafer control system, according to some embodiments.

FIG. 2 illustrates a top down view of one embodiment of a capacitive sensor 202, which may be used in FIG. 1. The capacitive sensor 202 has a sensor electrode 208, surrounded by an insulator element 206, which is surrounded by a guard electrode 204. Lead 210 is coupled to the guard electrode, and lead 212 is coupled to the sensor electrode. The electrical leads may be housed in an electrical lead assembly 240, which provides an insulation casing for the separate leads. The leads 210 and 212 may be coupled to the system controller 136. When an electric voltage is applied to the guard electrode 204, an electromagnetic field is generated between the guard electrode and the sensor electrode, and a voltage can be detected from the lead 212. The capacitive value is determined by the effective area covering the magnetic field. When the wafer 110, which is not electrically grounded, enters the field of view of the capacitive sensor 202, it alters the magnetic field and affects the voltage measurement. Thus, the capacitive sensor 202 can measure a coverage percent that the edge of the wafer 110 overlaps the sensor 202 as a voltage. Further, the Z-direction sensor 142 can improve the accuracy of the edge sensors 138 and 140, by determining how far away the wafer edge is to the sensors 138 and 140, so that values can be determined for that specific distance. (Measurements and calculations may be performed by the system controller 136, which may send an output to the fluid delivery system 132 to control one or more actuators that affect the position of the wafer 110 in the X and/or Y directions. In some embodiments, a first set of actuators are flow control valves that control the amount fluid being sent to nozzles on the support body 124.)

However, since the wafer 110 is also rotating (see arrow 170), measurement systems are needed for tracking the rotation. The outer diameter edges of wafers are not typically uniform. FIG. 1 illustrates a wafer having a notch 160 or other feature. The notch 160 may be a semicircle with about a 1.5-2 mm diameter. Notches may have other shapes as well, such as a triangular "V" shape or a square shape. Alternatively, some circular wafers have a flat edge on a portion of their circumference. The non-uniform feature, such as the notch 160, may be monitored to determine the rotation speed of the wafer 110. But when the notch rotates through an edge sensor's field of view, it introduces an error to the positioning control system. This error caused by the measurement of the notch causes the control system to try and "re-center" the wafer, which actually moves the wafer off-center. As soon as the notch has passed through the sensor, the sensor monitors the true edge of the wafer again and prompts another correction. Therefore systems, devices and methods are needed to reduce or eliminate positioning errors caused by rotational movement of non-uniform portions of the wafer edge.

Figure 3:
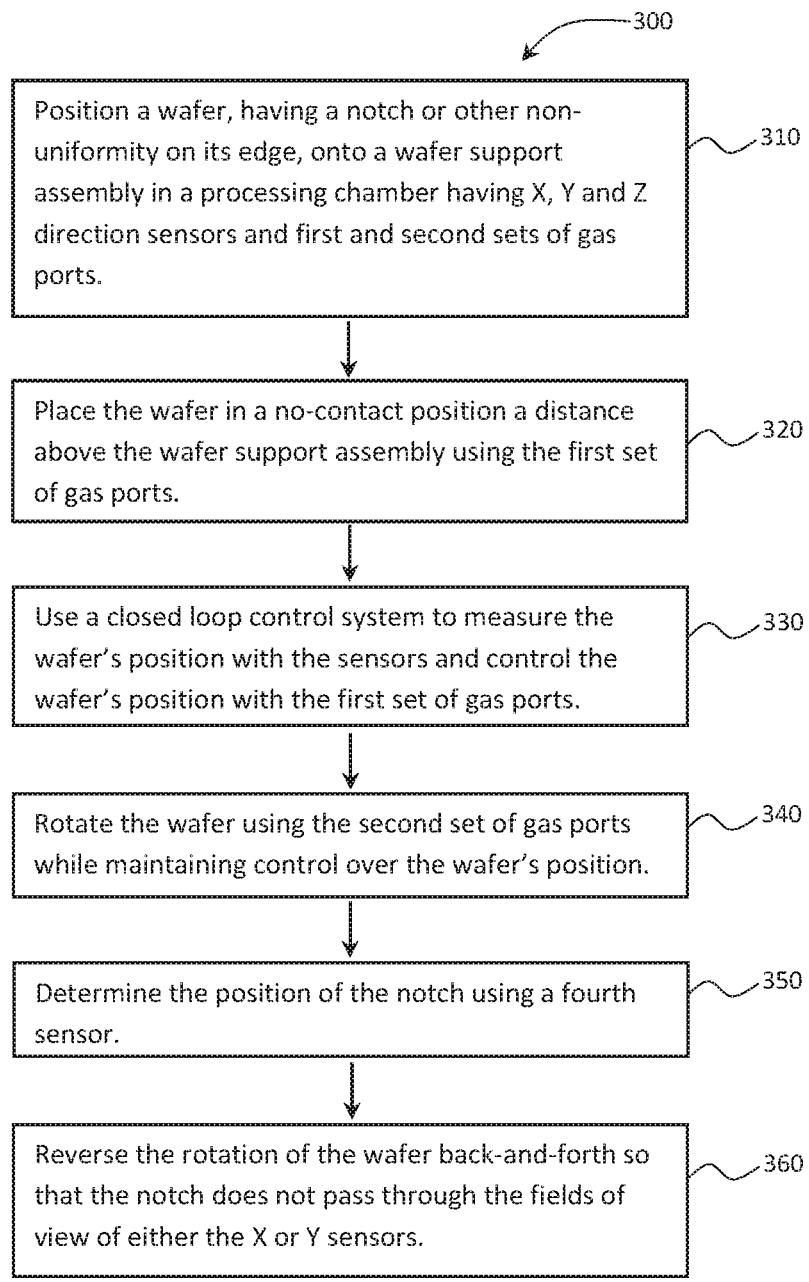
FIG. 3 illustrates a flow chart of a method to control wafer position and rotation, according to some embodiments.
Figure 4:
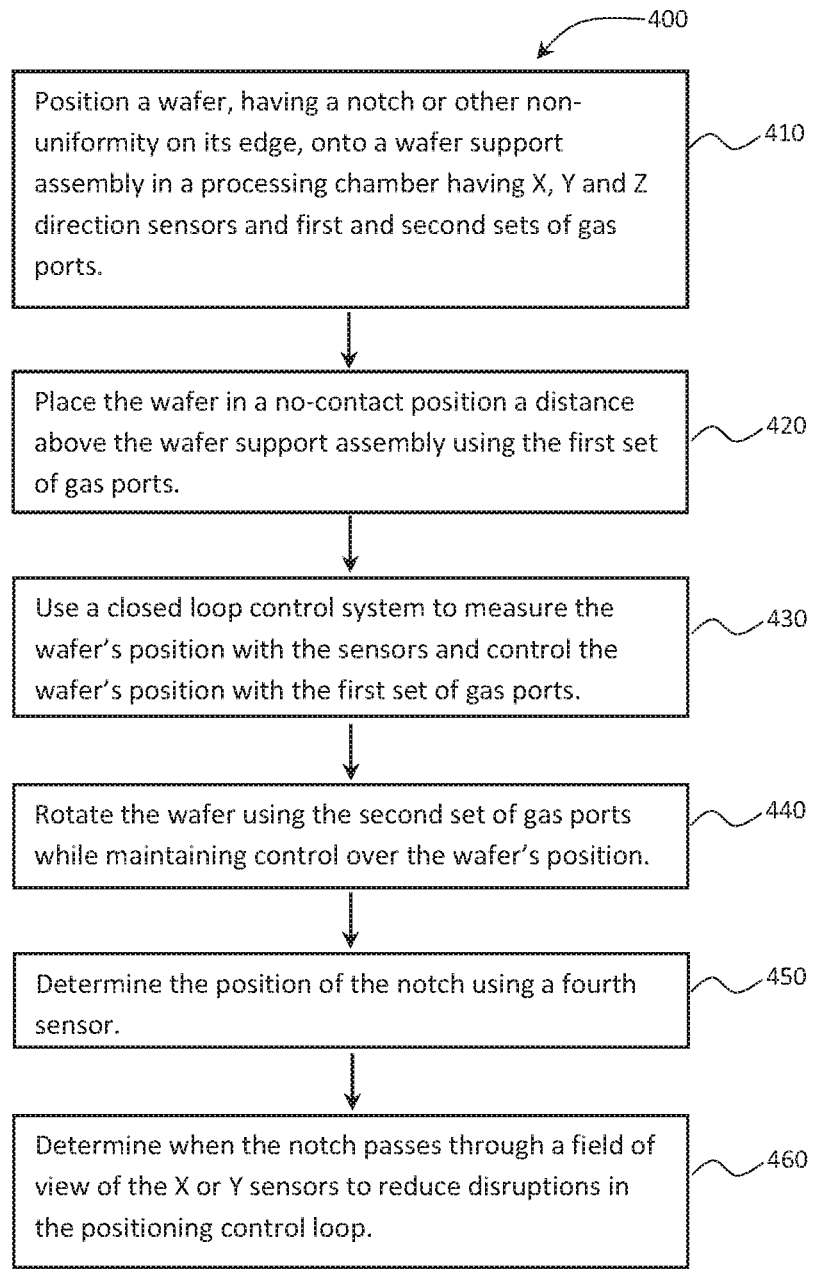
FIG. 4 illustrates a flow chart of a method to control wafer position and rotation, according to some embodiments.
Figure 5:
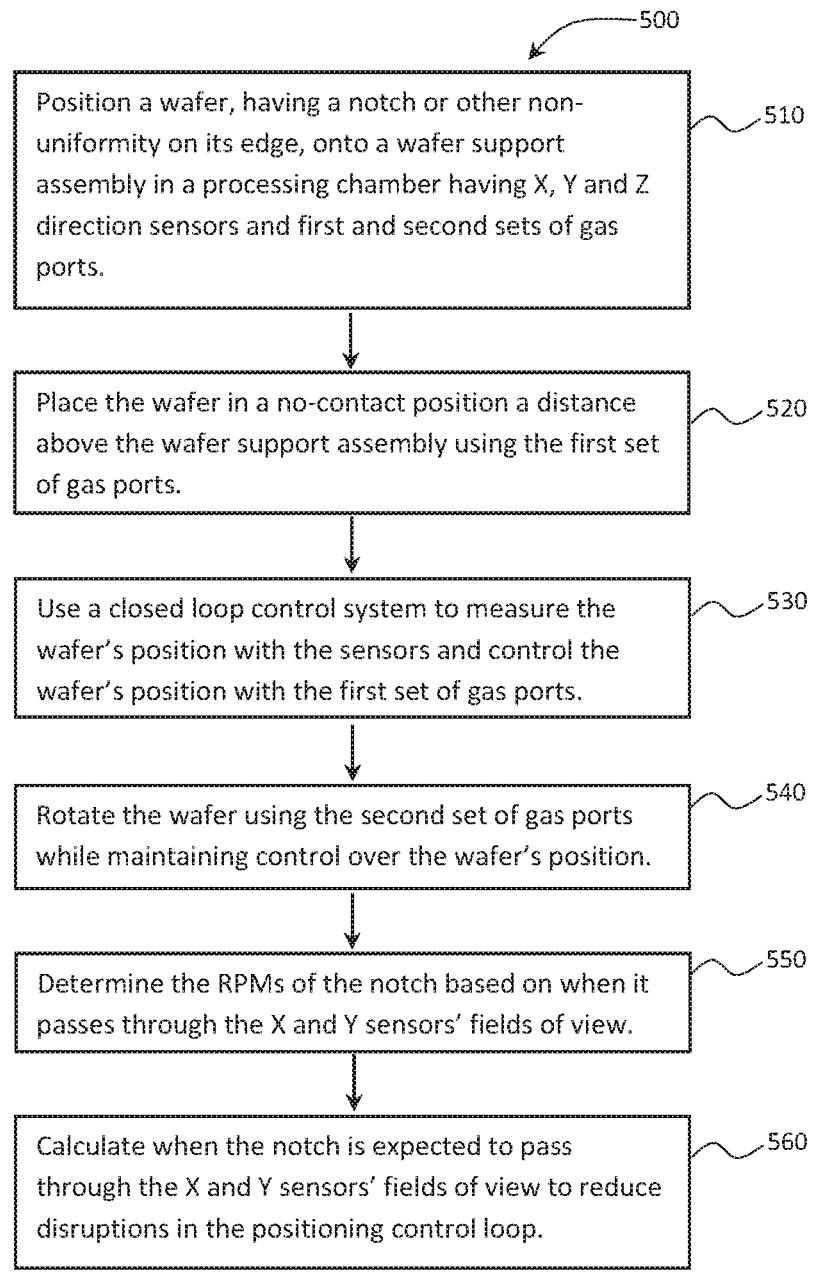
FIG. 5 illustrates a flow chart of a method to control wafer position and rotation, according to some embodiments.

FIGS. 3-5 provide embodiments of example control methods that may be used with the device of FIG. 1 (or other suitable devices) to measure and control rotation of the wafer 110. In FIG. 3, a control method 300 is provided in which a fourth sensor 190 is used to determine the position of the notch 160 or other non-uniform portion of the wafer (step 350), and the controller 136 controls the angular position and/or rotation of the wafer by reversing the rotation back-and-forth so that the notch 160 does not pass through the field of view of any edge sensor (step 360). Sensor 190 may be a camera, coupled to the system controller 136, which tracks the position of the notch 160, as it rotates around the wafer 110, as a function of an angle theta. In some embodiments, the camera 190 may be protected by a window. In further embodiments, the camera 190 may be placed outside the process chamber. Other sensor types may also be used, which do not track the complete movement of the notch 160. For example, a plurality of optical or capacitive tracking sensors (not shown) may be positioned around the circumference of the support body 124 to track when the notch passes the locations of the tracking sensors, so that the controller 136 can reverse the rotation of the wafer 110 before the notch 160 (or other non-uniformity) enters the field of view of one of the edge measuring sensors 138 or

140. Rotation speed and/or acceleration may also be calculated to assist this process. In another possible embodiment, the separation angle 194 between sensors 138 and 140 could be reduced to provide a greater range of rotation movement of the wafer 110.

In method 300, a first step 310 provides for positioning a wafer, having a notch or other non-uniformity on its edge, onto a wafer support assembly in a processing chamber having X, Y and Z direction sensors and first and second sets of fluid ports (such as gas nozzles in fluid communication with flow control valves). In step 320, gas flow is activated through the first set of gas ports, and the wafer is placed in a no-contact position a distance above the wafer support assembly. In step 330, the controller 136 executes a closed loop control system to measure the wafer's position with the sensors and to control the wafer's position with the first set of gas ports. In step 340, the controller 136 rotates the wafer using the second set of gas ports while maintaining control over the wafer's position with the first set of gas ports. As discussed above, in step 350, the controller 136 determines the position of the notch 160 using a fourth sensor 190, and in step 360, reverses the rotation of the wafer 110 back-and-forth so that the notch does not pass through the fields of view of either the X or Y sensors. The fourth sensor 190 may be a rotation sensor, such as a camera. The fourth sensor 190 may be used to control angular position of the notch 160. Further, the fourth sensor 190 may have a field of view, and the angular position of the notch 160 may be controlled to stay within the field of view of the fourth sensor 190. Additionally, more rotation sensors may be used to expand the total field of view, such that the notch 160 may be controlled to stay within the total field of view.

FIG. 4. Illustrates another control method 400, according to other embodiments. In method 400, steps 410-450 are similar to the corresponding steps in FIG. 3. However, in step 460, the system controller 136 determines when the notch passes through a field of view of the X sensor 138 and when the notch passes through a field of view of the Y sensor 140, so that the control algorithm can ignore the measurement disruption caused by the passing notch or other non-uniformity, thereby reducing or eliminating disruptions in the positioning control loop. In this embodiment, the controller 136 can use a second set of actuators (such as control valves) to control the fluid flow to the second set of gas ports, which affects the torque applied to the wafer 110. Accordingly, the controller 136 can control angular position, angular velocity, and/or acceleration of the wafer 110 as it rotates. In some embodiments, the controller 136 calculates RPM based on frequency of notch detection by the fourth sensor 190. As discussed above, the fourth sensor 190 may be a camera, or may be an optical or a capacitive sensor set to measure the frequency of notch detection. The controller 136 may then calculate when the notch 160 or other non-uniformity is expected to pass through the field of view of either the X or Y sensors 138 and 140, respectively. A control algorithm may then minimize or eliminate any disruption caused by the notch passing through the field of view of any edge sensor.

Further, one or both of the sensors 138 and 140 may be used in determining the RPM calculation and in determining the direction of rotation. Direction may also be known based on the output to the second set of actuators that affect wafer rotation. With RPM and direction information known, the system controller 136 can use this rotational velocity measurement to calculate and predict when the next "glitch" will be experienced by both the X and Y sensors. The positioning control algorithm can then use this prediction to ignore or minimize the input from the X and/or Y sensors during the time span when a glitch is expected (i.e. when the notch 160 is passing by the sensor). This would therefore enable smooth, X-Y positioning control that would not be affected by the notch's passing. The faster the wafer 110 is rotating, the less time the positioning control algorithm needs to ignore the X and/or Y sensors. Further embodiments obtain stable results by maintaining stable RPM, such as by not accelerating or decelerating the wafer. Additional embodiments measure acceleration values and then use the known acceleration values to implement effective filtering. These approaches provide an important benefit to the overall control of the wafer, because when the positioning control algorithm responds to a glitch, it tends to introduce instability into the positioning control due to the step function nature of the sensor signals during and after the presence of the notch. Ignoring the notch removes that self introduced instability, without compromising the control systems ability to respond effectively to real wafer drift or positioning disruptions. Real wafer positioning disruptions tend to affect the sensor signal in a smother and slower manner than the glitch.

FIG. 5 provides another control method 500 to obtain the benefits discussed above without the use of the fourth sensor 190. In method 500, steps 510-540 are similar to the corresponding steps in FIGS. 3 and 4. However, in step 550, the controller 136 determines the RPMs of the notch 160 based on when it passes through the X and Y sensors' fields of view, and in step 560, calculates when the notch is expected to pass through the X and Y sensors' fields of view. Thus, in step 560 the controller 136 reduces disruptions in the positioning control loop, as discussed above. One or more rotational sensors may also be used with this embodiment.

Capacitive sensors used in the devices and methods discussed above have additional advantages over optical sensors in that capacitive sensors are more resistant to harsh process conditions of high heat and/or deposits of process materials, and thus less sensor drift occurs. In further embodiments, additional numbers of sensors may be used when the cost of the extra components is warranted to provide either back-up or additional sensing. For example, in one embodiment, four edge sensors are provided, spaced at 90° angles from adjacent sensors. In a further embodiment, two Z-sensors are provided, spaced on opposite ends of the support body 124.

Design flexibility and increased sensitivity may be achieved by selecting sensor sizes that give desired minimum and maximum sensitivity ranges. For example, a vertical distance from the wafer 110 should be selected that allows for good sensitivity. In some examples, sensing ranges may be as much as 20 mm or more. Other embodiments may use a vertical distance selected from a range of about 2 to about 15 mm. However, capacitive sensitivity is better with smaller voltage ranges. In some examples, a distance of 2 mm results in a capacitive reading of 11 volts and a distance of 15 mm results in a reading of 2 volts. Accordingly, the 2 mm distance is selected to increase sensitivity for measurements by creating a wider range of voltage measurements. Further, changing the size of the sensors or their components may alter the distance ranges, thus allowing for design flexibility for different application. In another example for an RTP process, the wafer is separated by 0.169 inches from a reflector plate or about 4.29 mm. Other distance ranges may be between about 1 to about 6 mm.

While the foregoing is directed to embodiments of the present invention, other and further embodiments of the invention may be devised without departing from the basic scope thereof, and the scope thereof is determined by the claims that follow.

The invention claimed is:

1. An apparatus for processing a substrate, comprising:
a chamber body defining an inner volume;
a substrate positioning assembly disposed in the inner volume, wherein the substrate positioning assembly is capable of positioning and rotating the substrate at least within a horizontal plane;
a first capacitive sensor disposed in the inner volume, wherein the first capacitive sensor is positioned to detect a location of an edge of the substrate at a first edge location;
a second capacitive sensor disposed in the inner volume, wherein the second capacitive sensor is positioned to detect the location of the edge of the substrate at a second edge location;
a third capacitive sensor disposed in the inner volume at a position between the first and second capacitive sensors, wherein the third capacitive sensor is positioned to detect a vertical location of the substrate; and
a controller coupled to the first, second, and third capacitive sensors, wherein the controller is programmed to determine a first time period when a non-uniform portion on the edge of the substrate passes through a field of view of the first capacitive sensor and to determine a second time period when the non-uniform portion passes through a field of view of the second capacitive sensor.

2. The apparatus of claim 1, wherein the first and second capacitive sensors are positioned at a 90 degree angle such that the first capacitive sensor measures the position of the substrate in the X direction and the second capacitive sensor measures the position of the substrate in the Y direction.

3. The apparatus of claim 2, wherein the third capacitive sensor is positioned between the first and second capacitive sensors on a same X-Y plane and the third capacitive sensor is positioned radially inwards such that the edge of the substrate is not within the field of view of the third capacitive sensor.

4. The apparatus of claim 2, further comprising:
a support body, wherein the first, second, and third capacitive sensors are disposed in cut outs in the support body.

5. The apparatus of claim 4, wherein the support body includes nozzles for directing fluid flow towards the substrate.

6. The apparatus of claim 5, wherein the first set of actuators are flow control valves capable of controlling the amount of fluid being sent to nozzles in the support body.

7. The apparatus of claim 1, wherein the controller is programmed to determine the revolutions per minute (RPM) of the substrate based on measuring when the non-uniform portion on the outer diameter edge of the substrate passes through the respective fields of view of the first and second capacitive sensors.

8. The apparatus of claim 1, further comprising a rotation sensor coupled to the controller and positioned to monitor the position of the non-uniform portion on the edge of the substrate.

9. The apparatus of claim 8, wherein the rotation sensor comprises a camera.

10. The apparatus of claim 8, further comprising a first set of actuators coupled to the controller and disposed to control the position of the substrate in the X and Y directions.

11. The apparatus of claim 10, further comprising a second set of actuators coupled to the controller and disposed to apply a torque to control the rotation of the substrate.

12. An apparatus for processing a substrate, comprising:
a chamber body defining an inner volume;
a substrate positioning assembly disposed in the inner volume, wherein the substrate positioning assembly is capable of positioning and rotating the substrate at least within a horizontal plane;
a first capacitive sensor disposed in the inner volume, wherein the first capacitive sensor is positioned facing towards a tangent line of the substrate at a first location of a circle that is substantially the same size as the circumference of the substrate to detect a location of an edge of the substrate at a first edge location;
a second capacitive sensor disposed in the inner volume, wherein the second capacitive sensor is positioned facing towards a tangent line of the substrate at a second location of the circle that is substantially the same size as the circumference of the substrate to detect the location of the edge of the substrate at a second edge location, wherein the first capacitive sensor and the second capacitive sensor are positioned at a separation angle less than 180 degrees around the circumference of the circle;
a third capacitive sensor disposed in the inner volume at a position between the first and second capacitive sensors, positioned closer to a midpoint of the substrate than the first capacitive sensor and the second capacitive sensor, positioned such that the edge of the substrate does not enter the field of view of the third capacitive sensor, and positioned to detect a vertical location of the substrate;
one or more rotation sensors configured to monitor a position of a non-uniform portion on the substrate and track an angular position and/or rotation of the substrate; and
a lamp disposed to provide backlighting to the underside of the substrate.

13. The apparatus of claim 12, wherein the first and second capacitive sensors are positioned at a 90 degree angle such that the first capacitive sensor measures the position of the substrate in the X direction and the second capacitive sensor measures the position of the substrate in the Y direction.

14. The apparatus of claim 12, wherein the rotation sensor comprises a camera.

15. The apparatus of claim 12, further comprising a first set of actuators disposed to control the position of the substrate in the X and Y directions.

16. The apparatus of claim 15, further comprising a second set of actuators disposed to apply a torque to control the rotation of the substrate.

17. The apparatus of claim 12, wherein the third capacitive sensor is positioned between the first and second capacitive sensors on a same X-Y plane and the third capacitive sensor is positioned radially inwards such that the edge of the substrate is not within the field of view of the third capacitive sensor.

18. The apparatus of claim 12, further comprising:
a support body, wherein the first, second, and third capacitive sensors are disposed in cut outs in the support body.

19. The apparatus of claim 18, wherein the support body includes nozzles for directing fluid flow towards the substrate.

20. The apparatus of claim 19, wherein the first set of actuators are flow control valves capable of controlling the amount of fluid being sent to nozzles in the support body.

* * * * *